(12) United States Patent
Kim et al.

(10) Patent No.: US 11,658,079 B2
(45) Date of Patent: May 23, 2023

(54) TEMPORARY INTERCONNECT FOR USE IN TESTING A SEMICONDUCTOR PACKAGE

(71) Applicant: Intel Corporation, Santa Clara, CA (US)

(72) Inventors: Hyoung Il Kim, Folsom, CA (US); Yi Xu, Folsom, CA (US); Florence Pon, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 979 days.

(21) Appl. No.: 16/250,683

(22) Filed: Jan. 17, 2019

(65) Prior Publication Data

US 2020/0235018 A1     Jul. 23, 2020

(51) Int. Cl.
*H01L 21/66* (2006.01)
*H01L 25/065* (2023.01)
*H01L 23/538* (2006.01)
*H01L 23/31* (2006.01)
*H01L 23/00* (2006.01)

(52) U.S. Cl.
CPC .......... *H01L 22/32* (2013.01); *H01L 23/3128* (2013.01); *H01L 23/5383* (2013.01); *H01L 23/5386* (2013.01); *H01L 24/09* (2013.01); *H01L 24/17* (2013.01); *H01L 24/49* (2013.01); *H01L 24/73* (2013.01); *H01L 25/0652* (2013.01); *H01L 2924/381* (2013.01)

(58) Field of Classification Search
CPC . H01L 23/32; H01L 23/3128; H01L 23/5383; H01L 23/5386; H01L 24/24; H01L 24/09; H01L 24/17; H01L 24/49; H01L 24/73; H01L 25/0652
See application file for complete search history.

(56) References Cited

U.S. PATENT DOCUMENTS

2008/0265389 A1* 10/2008 Hsu ..................... H01L 25/0657
257/E23.18
2019/0206827 A1* 7/2019 Eskandar ............ H01L 25/0657

FOREIGN PATENT DOCUMENTS

KR     200169690 Y1 *   2/2000   ........... H01R 13/696

\* cited by examiner

*Primary Examiner* — Jasmine J Clark
(74) *Attorney, Agent, or Firm* — Schwabe, Williamson & Wyatt P.C.

(57) ABSTRACT

Embodiments described herein are directed to a temporary interconnect for use in testing one or more devices (e.g., one or more dies, inductors, capacitors, etc.) formed in semiconductor package. In one scenario, a temporary interconnect acts an electrical bridge that electrically couples a contact pad on a surface of a substrate and the test pad. Coupling the contact pad and the test pad to each other enables the device(s) coupled the contact pad to be tested. Following testing, the temporary interconnect can be removed or severed so that an electrical break is formed in the conductive path between test pad and the contact pad.

25 Claims, 10 Drawing Sheets

TEMPORARY INTERCONNECT FOR USE IN TESTING A SEMICONDUCTOR PACKAGE

BACKGROUND

Field

Embodiments described herein generally relate to semiconductor packaging. More particularly, but not exclusively, embodiments described herein relate to a temporary interconnect for use in testing a semiconductor package.

Background Information

A semiconductor package generally includes one or more contact pads coupled to devices (e.g., one or more dies, inductors, capacitors, etc.) within or on the semiconductor package. The contact pad(s) may be formed in or on the semiconductor package for propagation of electrical signals (e.g., high speed signals, etc.).

To ensure proper operation of a semiconductor package, its connections, and its devices, the semiconductor package may be tested. One device used for testing a semiconductor package is a test socket, which may electrically connect contact pads on the semiconductor package to a test apparatus. The test socket may include: (i) a housing for the semiconductor package; (ii) a test pad; and (iii) a probe pin under the test pad for contacting a contact pad on the semiconductor package.

Despite the benefits of test sockets, currently available test sockets cannot support testing of a semiconductor package's contact pads that have fine or ultra-fine pitches (e.g., pitches that are less than 0.3 millimeters (mm), etc.). In order to test such contact pads, strip- or wafer-level probe technologies are employed. Strip- or wafer-level probe technologies require forming test pads on a substrate near contact pads. In one scenario, the test pads—which usually have pitches that are 0.3 mm or more—are fanned out from the contact pads having fine or ultra-fine pitches. In this scenario, long traces (e.g., traces that are greater than 3.0 mm in length, etc.) are used to couple the fanned-out test pads to the contact pads.

There are drawbacks associated with strip- and wafer-level testing techniques. One drawback is that testing of a semiconductor package having contact pads with fine or ultra-fine pitches using fanned-out test pads may be marred with signal integrity issues. This is because the test signals are propagated over long traces (e.g., traces that are greater than 3.0 mm in length, etc.) that couple the fanned-out test pads to the contact pads.

Another drawback is that strip- and wafer-level testing techniques are costly and imprecise. This is because these testing techniques are inadequate for testing semiconductor packages that have devices with fine or ultra-fine pitches (e.g., pitches that are less than 0.3 millimeters (mm), etc.). Specifically, strip- and wafer-level testing techniques cannot detect manufacturing defects in devices that have fine or ultra-fine pitches. The inability to test semiconductor packages for such manufacturing defects potentially reduces the yield associated with semiconductor packaging and manufacturing techniques, which in turn makes these testing techniques imprecise and costly.

One more drawback is that the electrical connections between the contact pads and the fanned-out test pads must be removed from a semiconductor package following testing in order to avoid creating signal interference issues or electrical shorts that could negatively affect the proper operation of the semiconductor package. However, this removal process is tedious, imprecise, and costly, which in turn reduces the yield and reliability of semiconductor packages. Furthermore, if the test pads are left coupled to the devices of the semiconductor package, the test pads and conductive traces to the test pads function as antennae and will induce unwanted interference during the operation of the semiconductor package.

The drawbacks discussed above reduce the yield of semiconductor packaging and manufacturing techniques. Thus, testing of semiconductor packages remains suboptimal.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

DETAILED DESCRIPTION

In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein are directed to a temporary interconnect for use in testing one or more devices (e.g., one or more dies, inductors, capacitors, etc.) formed in a semiconductor package. In one embodiment, the temporary interconnect is disposed in a conductive path between a contact pad and a test pad in order to couple the contact pad and a test pad to each other. The temporary interconnect acts an electrical bridge that electrically couples the contact pad and the test pad so that device(s) coupled the contact pad can be tested by application of a voltage to the test pad and acquiring data to determine proper operation of the device(s). Following testing, the temporary interconnect can be removed or severed so that an electrical break is formed in the conductive path between test pad and the contact pad. In this way, the temporary interconnect acts as a cost-effective and relatively precise tool (when compared to strip- and wafer-level testing techniques) for use in testing devices formed in or on a semiconductor package. The temporary interconnect, therefore, can assist with increasing the yield associated with semiconductor packaging and manufacturing.

Several advantages are associated with embodiments of the temporary interconnect described herein. For example, the temporary interconnect obviates the need to use a costly and imprecise process to remove the test pad from a semiconductor package after testing is performed. For one more example, electrical breaks that remain after removal of a temporary interconnect prevent the test pad from functioning as antennae that introduce unwanted interference during the operation of the semiconductor package. For yet another example, the temporary interconnect can be used for testing semiconductor packages to detect manufacturing defects that cannot be detected by strip- and wafer-level testing techniques.

In one embodiment, the temporary interconnect comprises a conductive structure attached to an adhesive, where the conductive structure comprises a trace. In one embodiment, the temporary interconnect is disposed on or in an electrical break formed in a conductive path between the contact pad and the test pad. In this way, the temporary interconnect electrically couples the test pad and the contact pad. Following testing, the conductive structure is removed from the semiconductor package.

In one embodiment, the temporary interconnect comprises a conductive structure attached to an adhesive, where the conductive structure includes a test pad and a trace coupled to the test pad. In one embodiment, the temporary interconnect is disposed on a surface of a substrate that is adjacent to a contact pad to form a conductive path between the contact pad and the test pad. In this way, the temporary interconnect electrically couples the test pad and the contact pad to each other. Following testing, the conductive structure (i.e., the test pad and the trace) is removed from the semiconductor package.

In one embodiment, the temporary interconnect comprises a conductive structure coupling a contact pad and test pad, where the conductive structure includes a wire bond. In one embodiment, the wire bond is part of a conductive path between the contact pad and the test pad that electrically couples the test pad and the contact pad to each other. Following testing, the wire bond is cut (e.g., severed) to create an electrical break in the conductive path.

Figure 1A:
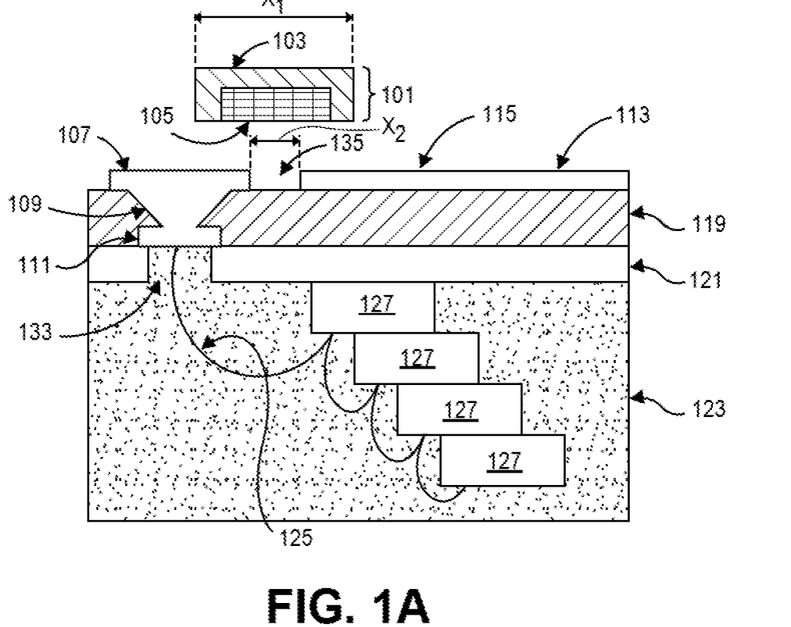
FIG. 1A is a cross sectional side view illustration of a semiconductor package comprising a conductive path between a contact pad and test pad that has an electrical break, according to an embodiment.

FIG. 1A is a cross sectional side view illustration of a semiconductor package comprising a conductive path between a contact pad 107 and a test pad 113 that has an electrical break 135, according to an embodiment. As used herein, a "conductive path" between two components or devices refers a path between the two components or devices that comprises at least one conductive structure, where the conductive structure electrically couples the two components or devices to each other and where the conductive structure is formed from a conductive material (e.g., copper, any other suitable conductive material known in the art, or any combination of suitable conductive materials known in the art). For example, a conductive path between two pads may comprise a trace. For another example, a conductive path between two pads may comprise a vertical interconnect access (via). For yet another example, a conductive path between a first pad and a die may comprise a trace, a second pad, a via, and a wire. The conductive path may be a continuous path with no electrical breaks in the path. Alternatively, the conductive path may be a noncontinuous path with at least one electrical break along the path. For example, an electrical break along a conductive path may result in the ends of the electrical path, on opposite sides of the electrical break, being electrically decoupled from each other.

The semiconductor package shown in FIG. 1A includes a die stack comprising dies 127. The semiconductor package shown in FIG. 1A may include one or more dies. For illustrative purposes, the semiconductor package shown in FIG. 1A includes four dies 127.

The semiconductor package shown in FIG. 1A includes a molding compound 123 encapsulating the dies 127. Furthermore, the semiconductor package includes a solder resist layer 121 positioned on the dies 127 and the molding compound 123. The solder resist layer 121 includes a solder resist opening (SRO) 133. Additionally, the semiconductor package includes a substrate 119 positioned on the solder resist layer 121. Furthermore, the semiconductor package includes: (i) a pad 111 in the substrate 119, where the pad 111 is coupled via an interconnection 125 (e.g., a wire, etc.) to the dies 127; a vertical interconnect access (via) 109 in the substrate 119, where the via 109 is coupled to the pad 111; and (iii) a contact pad 107 on a surface of the substrate 119, where the via 109 is coupled to the contact pad 107. In short, the contact pad 107 is coupled to the dies 127 through the interconnection 125, the pad 111, and the via 109. The semiconductor package shown in FIG. 1A also includes a test pad 113 and trace 115 on a surface of the substrate 119, where the test pad 113 and the trace 115 are coupled to each other.

As shown in FIG. 1A, a conductive path between the contact pad 107 and the test pad 113 comprises the trace 115 and an electrical break 135. In other words, the conductive path between the contact pad 107 and the test pad 113 is noncontinuous. The electrical break 135 prevents the contact pad 107 and the test pad 113 from being electrically coupled to each other. In one embodiment, a temporary interconnect 101 can bridge the electrical break 135 so that the contact pad 107 is coupled to the test pad 113. In one embodiment, the temporary interconnect 101 includes an adhesive 103 and a conductive structure 105. The conductive structure 105 can be formed from copper or any other suitable material or combination of suitable materials known in the art. The adhesive 103 can be formed from any suitable adhesive or combination of suitable adhesives known in the art. As shown in FIG. 1A, the adhesive 103 encapsulates a top surface and side surfaces of the conductive structure 105 without encapsulating a bottom surface of the conductive structure 105. However, other embodiments are not so limited. For example, the adhesive 103 may encapsulate the side surfaces and a portion of the top surface of the conductive structure 105. In one embodiment, a size $X_1$ of the temporary interconnect 101 is equal to or greater than a size $X_2$ of the electrical break 135. In this way, when the temporary interconnect 101 is disposed on or in the electrical break 135 (as described below in connection with FIGS. 1C-1D), the contact pad 107 and the test pad 113 are coupled to each other.

Figure 1B:
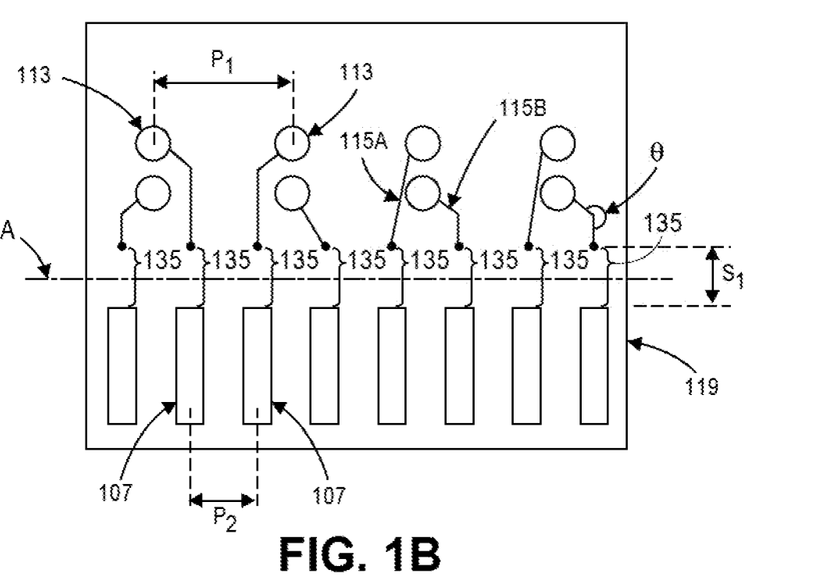
FIG. 1B is a plan view illustration of the semiconductor package shown in FIG. 1A, according to an embodiment.

Referring now to FIG. 1B, a plan view illustration of the semiconductor package shown in FIG. 1A is shown. The substrate 119 includes: (i) test pads 113; (ii) traces 115A-115B coupled to the test pads 113; (iii) contact pads 107; and (iv) electrical breaks 135 between the traces 115A-115B and the contact pads 107. In one embodiment, each contact pad 107 is paired with a single one of the test pads 113. For brevity, the term "pair" and its variations, as used herein, refer to a contact pad and a test pad that are paired together.

Each electrical break 135 between a pair shown in FIG. 1B has a size $S_1$. Furthermore, each electrical break 135 is adjacent to another electrical break 135 and is aligned along a common axis A, as shown in FIG. 1B. A size of an electrical break 135 between a pair can differ from a size of another electrical break 135 between another pair, even though both electrical breaks 135 are aligned along the common axis A.

In FIG. 1B, there are two types of traces 115. The first type of trace is the trace 115A, which is a linear trace that is part of a conductive path between a pair (i.e., a contact pad 107 and a test pad 113). The second type of trace is the trace 115B, which comprises multiple linear segments. The multiple linear segments are connected at a point where an angle θ between the linear segments is greater than zero degrees. Each type of the traces 115 terminates at an electrical break 135. Consequently, a pair (i.e., a contact pad 107 and a test pad 113) associated with a trace 115 is not electrically coupled. In one embodiment, a maximum allowable length of the trace 115 is 3.0 mm.

In FIG. 1B, a pitch $P_1$ of the test pads 113 is equal to or greater than a pitch $P_2$ of the contact pads 107. When the pitch $P_1$ of the test pads 113 is greater than the pitch $P_2$ of the contact pads 107, the test pads 113 are fanned out from the contact pads 107. In one embodiment, the pitch $P_1$ is at least 0.3 mm. In one embodiment, the pitch $P_2$ is less than 0.3 mm. In one embodiment, the pitch $P_2$ is a fine or ultra-fine pitch.

Figure 1C:
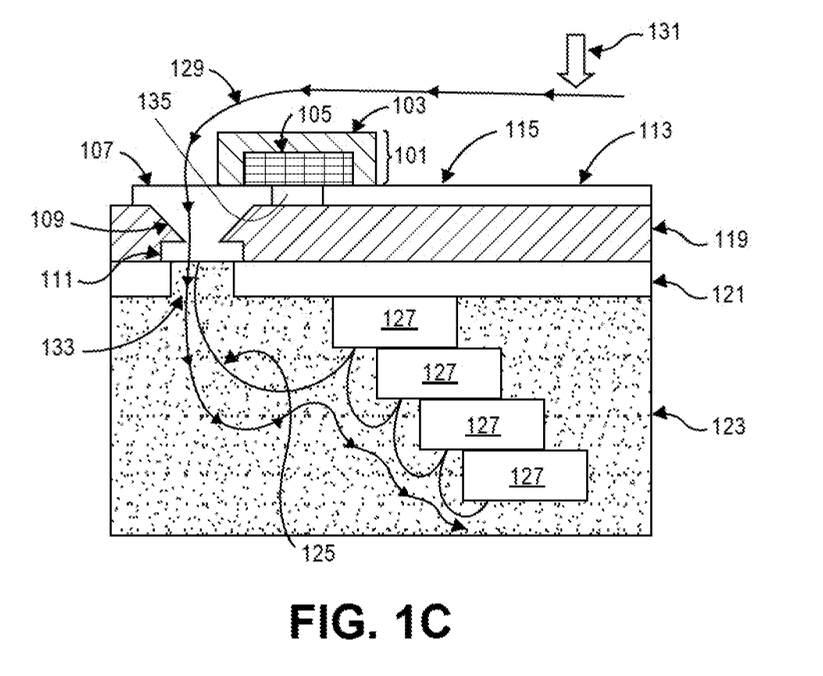
FIG. 1C is a cross sectional side view illustration of a semiconductor package having a temporary interconnect disposed thereon to bridge the electrical break shown in FIG. 1A, according to an embodiment.

FIG. 1C is a cross sectional side view illustration of a semiconductor package having a temporary interconnect 101 disposed thereon to bridge the electrical break 135 described above in connection with FIG. 1A, according to an embodiment. In one embodiment, the adhesive 103 of the temporary interconnect 101 attaches the conductive structure 105 of the temporary interconnect 101 to the contact pad 107 and the trace 115. For example, and as shown in FIG. 1C, the adhesive 103 attaches the bottom surface of the conductive structure 105 to the top surface of the contact pad 107 and the top surface of the trace 115 over or in the electrical break 135.

The adhesive 103 enables bringing the conductive structure 105 into physical contact with both the contact pad 107 and the trace 115 by positioning the conductive structure 105 in or over the electrical break 135. In this way, the temporary interconnect 101 replaces the electrical break 135 in the conductive path between the contact pad 107 and the trace 115, which in turn results in the temporary interconnect 101 enabling the contact pad 107 and the test pad 113 to be electrically coupled to each other. More specifically, the conductive structure 105 replaces the electrical break 135 so that the conductive path (which includes the trace 115) between the contact pad 107 and the test pad 113 is fully formed.

Following attachment of the conductive structure 105 to the contact pad 107 and the trace 115, a voltage 131 can be applied to the test pad 113. The voltage 131 causes a current 129 to flow from the test pad 113 to the dies 127 through the trace 115, the conductive structure 105, the contact pad 107, the via 109, the pad 111, and the interconnection (e.g., wire, etc.) 125. Data can then be acquired from the test pad 113 to determine proper operation of the semiconductor package shown in FIG. 1C. After testing is performed, the temporary interconnect 101 can be removed (e.g., as shown above in FIG. 1A) by stripping the adhesive 103 from the contact pad 107 and the trace 115. For example, the temporary interconnect can be removed by stripping the adhesive 103 from the surface of the contact pad 107 and the surface of the trace 115.

Using the temporary interconnect 101 has several benefits that can assist with increasing the yield associated with semiconductor packaging and manufacturing. For example, the temporary interconnect 101 obviates the need to use a costly, complex, and imprecise process to remove the test pad 113 from the substrate 119. For one more example, the electrical break 135, which remains after the temporary interconnect 101 is removed, prevents the test pad 113 from functioning as an antenna that introduces unwanted interference during the operation of the semiconductor package shown in FIG. 1C. For yet another example, the temporary interconnect 101 can be used to test semiconductor packages so as to detect manufacturing defects in devices having fine or ultra-pitches (e.g., pitches that are less than 0.3 mm). As explained above, these manufacturing defects cannot be detected by strip- and wafer-level testing techniques.

Figure 1D:
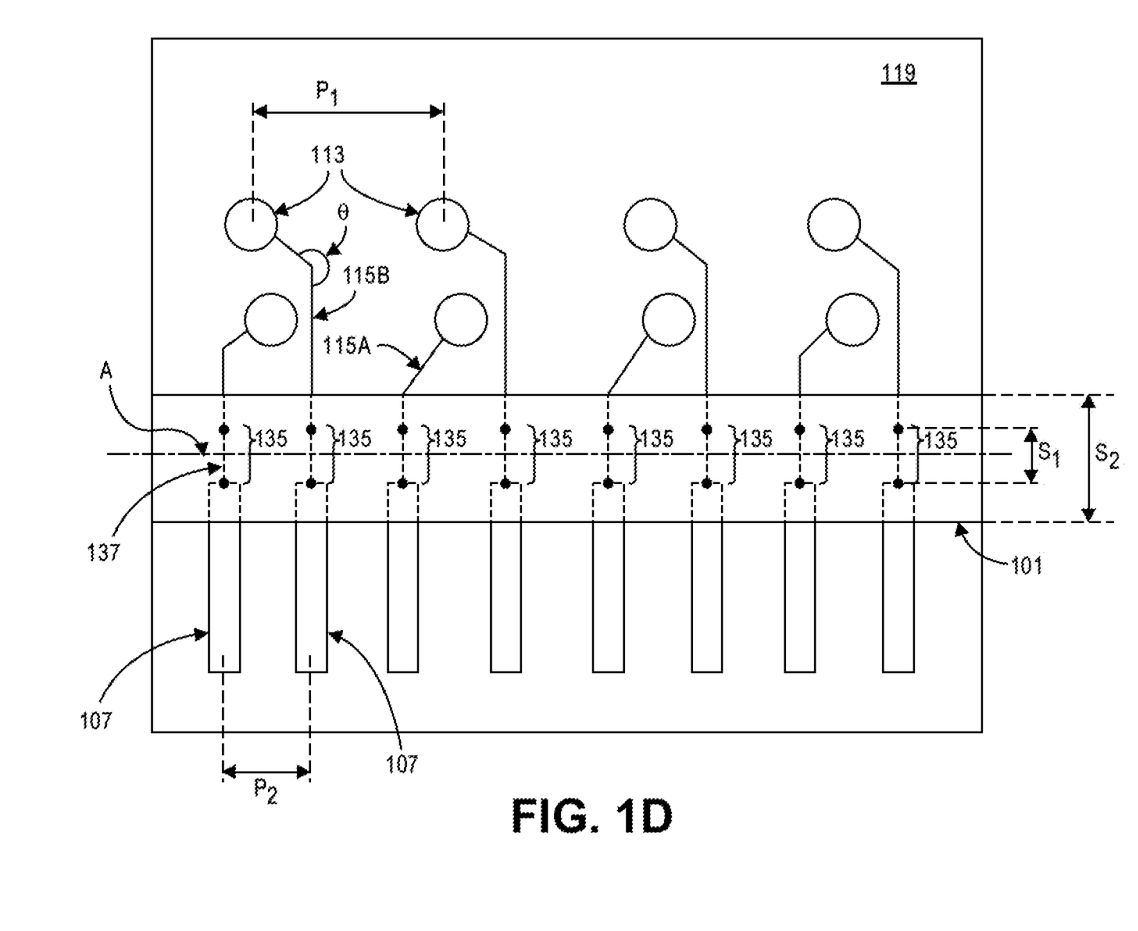
FIG. 1D is a plan view illustration of the semiconductor package shown in FIG. 1C, according to an embodiment.

Moving on to FIG. 1D, a plan view illustration of the semiconductor package shown in FIG. 1C is presented. As shown, the temporary interconnect 101 is positioned over the electrical breaks 135 to create a continuous conductive path between the traces 115 and the contact pads 107. Consequently, the contact pads 107 and the traces 115 (which are coupled to the test pads 113) are electrically coupled 137 to each other. As a result, the test pads 113 and the contact pads 107 are electrically coupled to each other.

In one embodiment, and with regard to FIG. 1D, each of the electrical breaks 135 between a test pad 113 and a contact pad 107 is adjacent to another electrical break 135. In a further embodiment, two or more of the electrical breaks 135 are aligned along a common axis. For example, and as shown in FIG. 1D, two or more of the electrical breaks 135 are aligned along a common axis A. Also, each of the electrical breaks 135 between a test pad 113 and a contact pad 107 has a same size $S_1$. Other embodiments, however, are not so limited. For example, an electrical break 135 may have a different size from another electrical break 135. Furthermore, a size $S_2$ of the temporary interconnect 101 is equal to or greater than the size $S_1$ of the electrical breaks 135. As a result, the temporary interconnect 101 is able to extend across the electrical breaks 135 to electrically couple 137 the test pads 113 and the contact pads 107 to each other. The embodiment of the temporary interconnect 101 shown in FIG. 1D extends across the electrical breaks 135, portions of the traces 115, and portions of the contact pads 107. In this way, the temporary interconnect 101 bridges the electrical breaks 135 and electrically couples 137 the traces 115 to the contact pads 107. Consequently, the test pads 113 and the contact pads 107 are electrically coupled to each other.

Figure 2A:
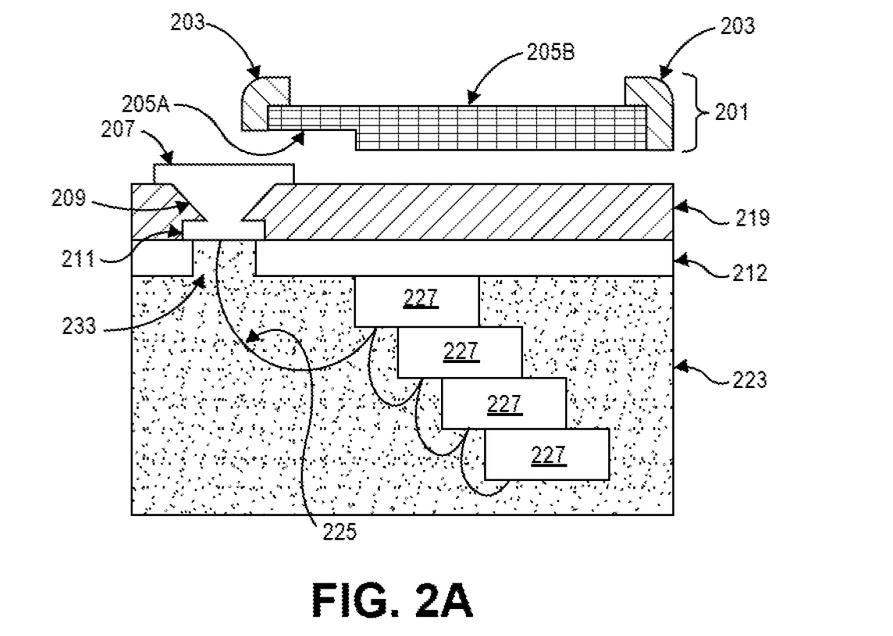
FIG. 2A is a cross sectional side view illustration of a semiconductor package comprising a contact pad and no test pad, according to an embodiment.

FIG. 2A is a cross sectional side view illustration of a semiconductor package comprising a contact pad 207 and no test pad, according to an embodiment. Many components and devices in or on the semiconductor package shown in FIG. 2A are similar to or the same as many components and devices in or on the semiconductor package shown in FIG. 1A, which is described above. For brevity, these components and devices are not described again unless it is necessary.

In FIG. 2A, a semiconductor package to be tested includes a contact pad 207 on a substrate 219. The contact pad 207 is coupled to dies 227 through a via 209, a pad 211, and an interconnection (e.g., wire, etc.) 225. The semiconductor package lacks any test pad formed thereon. Instead, testing the semiconductor package will be performed using a temporary interconnect 201. In one embodiment, the temporary interconnect 201 comprises a conductive structure 205 and an adhesive 203. In one embodiment, the conductive structure 201 comprises a removable trace 205A coupled to the removable test pad 205B. The conductive structure 201 can be formed from copper or any other suitable material or combination of suitable materials known in the art. The adhesive 203 can be formed from any suitable adhesive or combination of suitable adhesives known in the art.

In one embodiment, the adhesive 203 encapsulates a portion of a top surface and the side walls of the conductive structure 205 without encapsulating the bottom surface of the conductive structure 205, as shown in FIG. 2A. Other embodiments, however, are not so limited. For example, the adhesive 203 may encapsulate the entire top surface and the side walls of the conductive structure 205 without encapsulating the bottom surface of the conductive structure 205. In FIG. 2A, the temporary interconnect 201 is not in physical contact with the contact pad 207. Additional details about disposing the temporary interconnect 201 on the contact pad 207 and the surface of the substrate 219 are described below in connection with FIGS. 2C-2D.

Figure 2B:
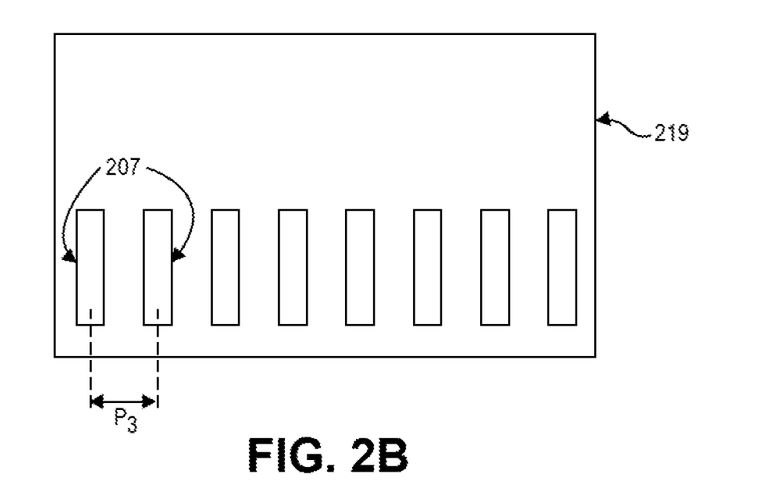
FIG. 2B is a plan view illustration of the semiconductor package shown in FIG. 2A, according to an embodiment.

FIG. 2B is a plan view illustration of the semiconductor package shown in FIG. 2A. As shown, the substrate 219 comprises multiple contact pads 207. Furthermore, a pitch between the contact pads 207 is $P_3$, which can be a fine or ultra-fine pitch. For example, the pitch $P_3$ can be less than 0.3 mm.

Figure 2C:
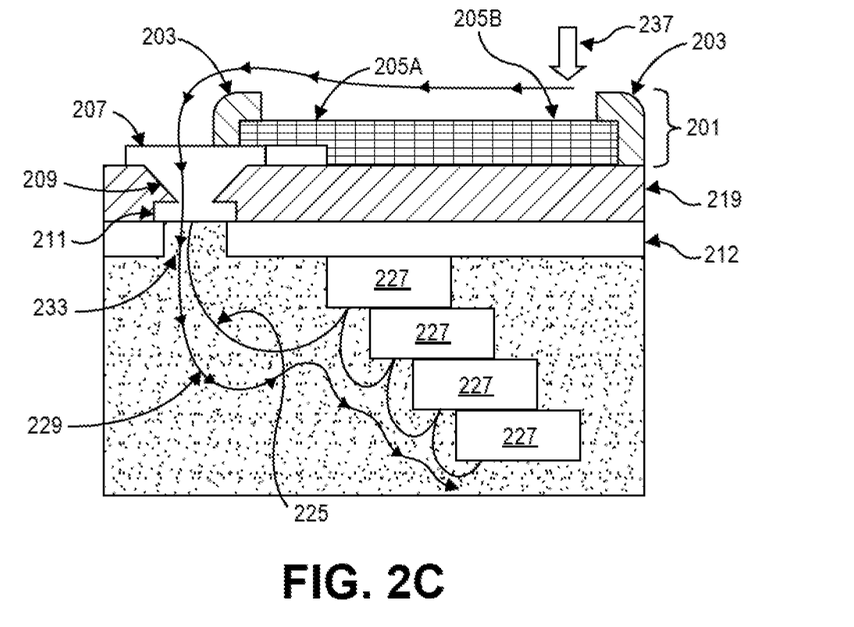
FIG. 2C is a cross sectional side view illustration of a semiconductor package having a temporary interconnect disposed thereon to enable testing of the contact pad shown in FIG. 2A, according to an embodiment.

With regard now to FIG. 2C, a cross sectional side view illustration of the semiconductor package shown in FIGS. 2A-2B having the temporary interconnect 201 disposed thereon is shown. The disposed temporary interconnect 201 enables testing of the contact pads 207 described above in connection with FIGS. 2A-2B, according to an embodiment.

Disposing the temporary interconnect 201 on the semiconductor package is performed by attaching, via the adhesive 203, the conductive structure 205 to the substrate 219 and the contact pad 207. For example, and as shown in FIG. 2C, the removable trace 205A is disposed on the surface of the contact pad 207 and the removable test pad 205B is disposed on the surface of the substrate 219. In this way, a conductive path comprising the removable trace 205A is formed between the contact pad 207 and the removable test pad 205B.

A voltage 237 can be applied to the disposed removable test pad 205B, which in turn creates a current 229 that flows from the removable test pad 205B to the dies 227 through the removable trace 205A, the contact pad 207, the via 209, the pad 211, and the interconnection (e.g., wire, etc.) 225. Data may then be acquired from the removable test pad 205B to determine proper operation of the devices (e.g., dies 227, etc.) formed in or on the semiconductor package shown in FIG. 2C. After testing is completed, the temporary interconnect 201 may be removed from the substrate 219. In one embodiment, the temporary interconnect 201 is removed by stripping the adhesive 203 from the surface of the substrate 219 and the surface of the contact pad 207. Given that the conductive structure 205 is also attached the adhesive 203, removing the adhesive 203 also results in removing the conductive structure 205 from the surface of the substrate 219 and the surface of the contact pad 207. In this way, testing the semiconductor package shown in FIG. 2C can be performed in a cost-effective and relatively precise manner (when compared to strip- or wafer-level testing techniques). Advantages associated with testing a semiconductor package using the conductive structure 201 are similar to or the same as the advantages associated with testing a semiconductor package using the conductive structure 101. These advantages are described above, so they are not discussed again for brevity.

Figure 2D:
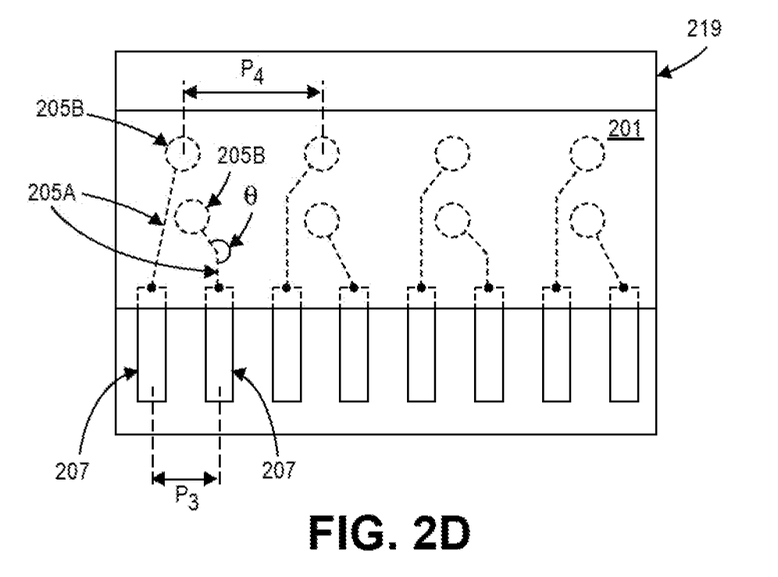
FIG. 2D is a plan view illustration of the semiconductor package shown in FIG. 2C, according to an embodiment.

FIG. 2D is a plan view illustration of the semiconductor package shown in FIG. 2C. As shown, the temporary interconnect 201 is disposed over surfaces of the contact pads 207 and the surface of the substrate 219. In this way, each temporary removable test pad 205B is coupled to a single contact pad 207 via a removable trace 205A. Similar to the traces 115A-115B described above in connection FIGS. 1A-1D, the removable traces 205B can be: (i) linear traces; or (ii) traces that have at least two linear segments, where an angle θ between two linear segments is greater than zero degrees. Furthermore, a pitch $P_4$ of the test pads 205B is equal to or greater than a pitch $P_3$ of the contact pads 207. In one embodiment, the pitch $P_4$ is at least 0.3 mm. In one embodiment, the pitch $P_3$ is less than 0.3 mm. In one embodiment, the pitch $P_3$ is a fine or ultra-fine pitch.

Figure 3A:
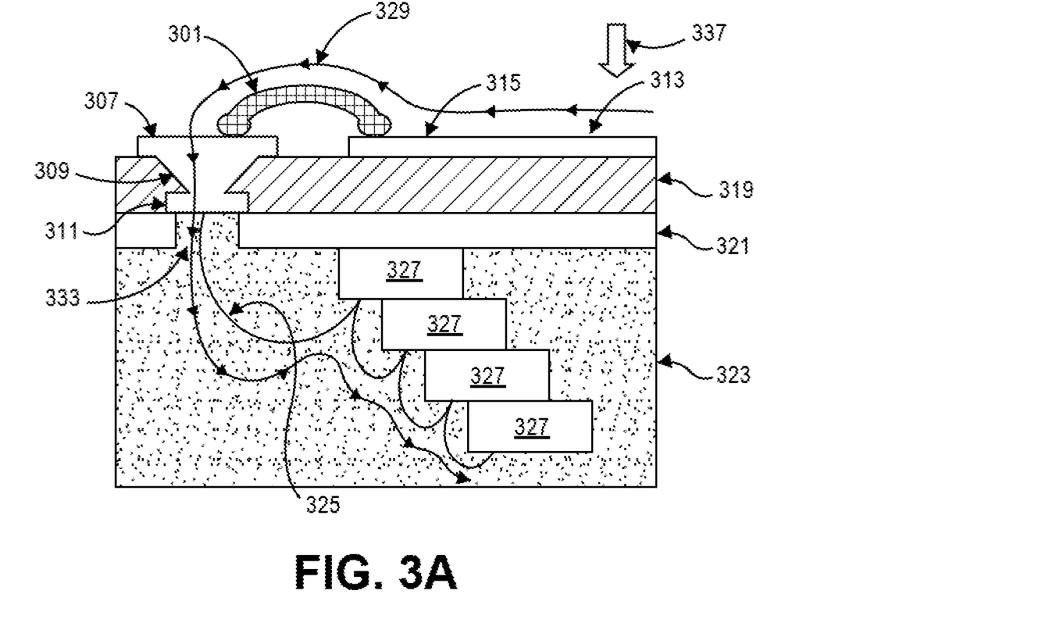
FIG. 3A is a cross sectional side view illustration of a semiconductor package comprising a conductive path between a contact pad and test pad, according to an embodiment.

With regard now to FIG. 3A, a cross sectional side view illustration of a semiconductor package comprising a conductive path between a contact pad 307 and test pad 313 is shown. Many components and devices in or on the semiconductor package shown in FIG. 3A are similar to or the same as many components and devices in or on the semiconductor package shown in FIG. 1A, which is described above. For brevity, these components and devices are not described again unless it is necessary.

A conductive path between the contact pad 307 and the test pad 313 comprises a wire bond 301 and a trace 315. As shown, the wire bond 301 extends from a surface of the trace 315 to a surface of the contact pad 307. Specifically, the wire bond 301 is formed by bonding a wire to a surface of trace 315 and a surface of the contact pad 307. Consequently, the wire bond 301 and the trace 315 electrically couple the contact pad 307 to the test pad 313. After the wire bond 301 is fabricated, a voltage 337 may be applied to the test pad 313. The voltage 337 creates a current 329 that flows from the test pad 313 to the dies 327 through the trace 315, the wire bond 301, the contact pad 307, the via 309, the pad 311, and the interconnection (e.g., wire, etc.) 325. Data may then be acquired from the test pad 313 to determine proper operation of the devices (e.g., dies 327, etc.) formed in or on the semiconductor package.

Figure 3B:
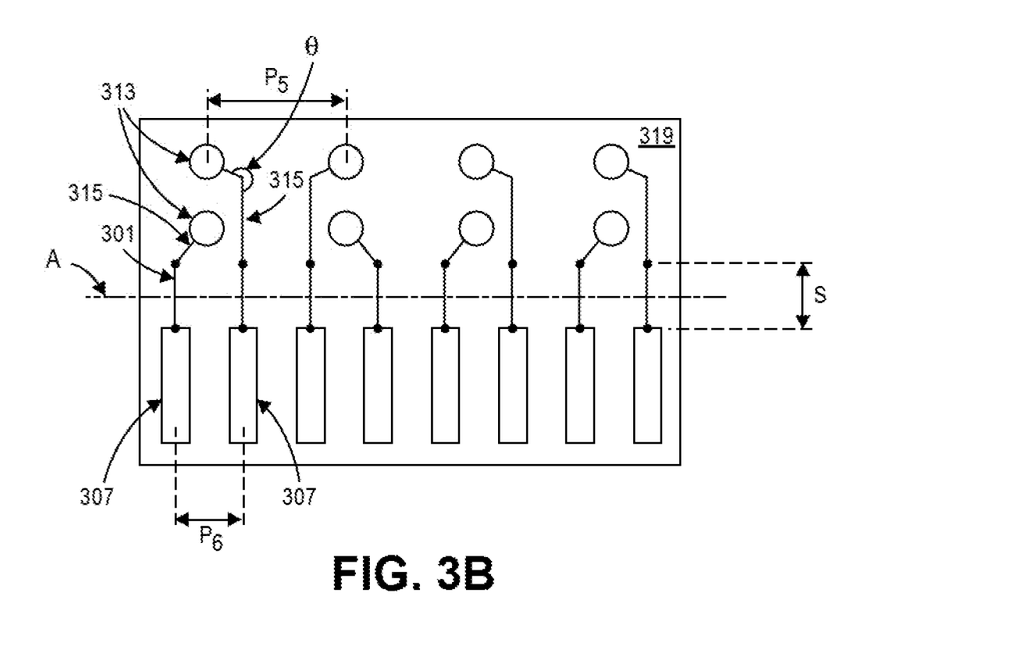
FIG. 3B is a plan view illustration of the semiconductor package shown in FIG. 3A, according to an embodiment.

Moving on to FIG. 3B, a plan view illustration of the semiconductor package shown in FIG. 3A is shown. The test pads 313 are coupled to the contact pads 307 via the traces 315 and the wire bonds 301. Therefore, a conductive path between each test pad 313 that is paired with a contact pad 307 comprises a trace 315 and a wire bond 301. Each wire bond 301 is adjacent to another wire bond and aligned along a common axis A. Furthermore, all the wire bonds 301 have a same size S. The traces 315 can be similar to or the same as the traces 115 described above in connection with FIGS. 1A-1D. Furthermore, a pitch $P_5$ of the test pads 313 is equal to or greater than a pitch $P_6$ of the contact pads 307. In one embodiment, the pitch $P_5$ is at least 0.3 mm. In one embodiment, the pitch $P_5$ is less than 0.3 mm. In one embodiment, the pitch $P_6$ is a fine or ultra-fine pitch.

Figure 3C:
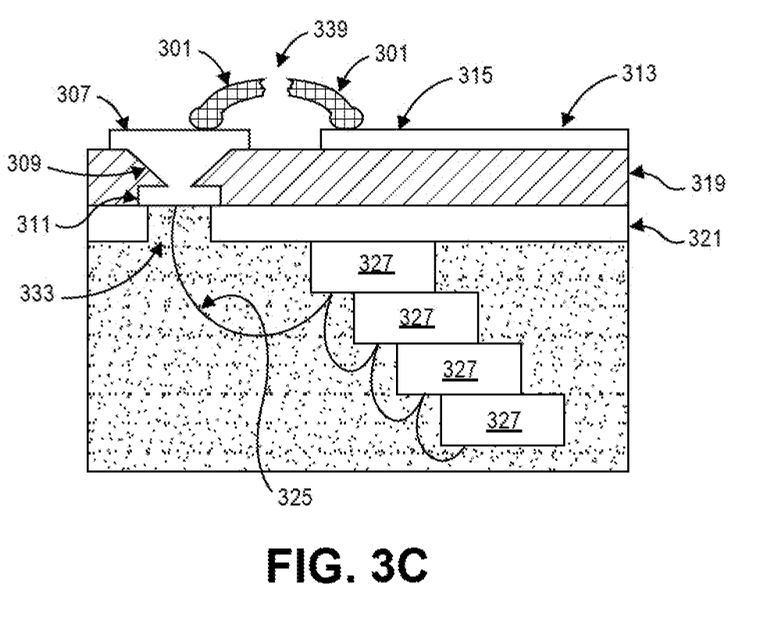
FIG. 3C is a cross sectional side view illustration of a semiconductor package comprising a conductive path between a contact pad and test pad that has an electrical break, according to an embodiment.

Referring now to FIG. 3C, a cross sectional side view illustration of a semiconductor package comprising a conductive path with an electrical break 339 is shown, according to an embodiment. Following performance of the testing operation described above in connection with FIGS. 3A-3B, the wire bond 301 is cut (i.e., severed) to create an electrical break 339 in the conductive path formed by trace 315 and the wire bond 301. In this way, the contact pad 307 and the test pad 313 are electrically (and physically) decoupled from each other.

The technique of using the wire bond 301 and the trace 315 to electrically couple the test pad 313 and the contact pad 307 to each other, testing the semiconductor package, and cutting the wire bond 301 after testing has several advantages. One advantage is that there is no need to use a costly, complex, and imprecise process to remove the test pad from the substrate 319, which in turn increases the yield associated semiconductor packaging and manufacturing. Another advantage is that such a technique enables testing of devices formed in or on the semiconductor package in a way that minimizes or eliminates the disadvantages of strip- or wafer-level testing techniques. The disadvantages of strip- and wafer-level testing techniques are described above, so they are not discussed again for brevity.

Figure 3D:
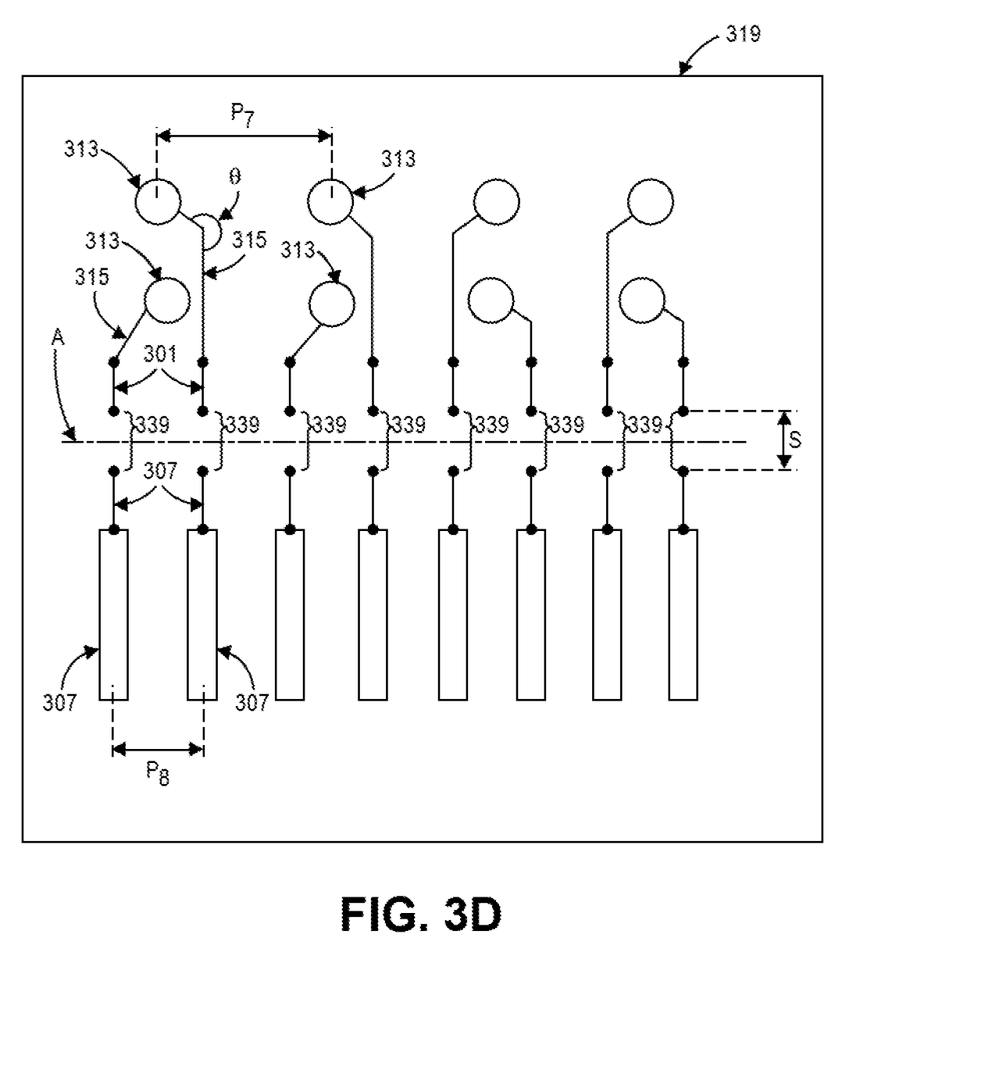
FIG. 3D is a plan view illustration of the semiconductor package shown in FIG. 3C, according to an embodiment.

Moving on to FIG. 3D, a plan view illustration of the semiconductor package shown in FIG. 3C is presented. As shown, the test pads 313 are no longer electrically coupled to the contact pads 307 because the wire bond 301 is cut to form electrical breaks 339. It is to be appreciated that each pair (i.e., a test pad 313 that is paired with a contact pad 307) has an electrical break 339 along its conductive path (i.e., a trace 315 coupled to a wire bond 301). In one embodiment, an electrical break 339 is adjacent to another electrical break 339 and is aligned with this other electrical break 339 along a common axis. For example, and as shown in FIG. 3D, at least two of the electrical breaks 339 are aligned along a common axis A. Furthermore, and in one embodiment, at least two of the electrical breaks 339 have a same size S and are aligned along a common axis. It is, however, to be appreciated that other embodiments are not so limited. For example, one electrical break 339 may have a size that differs from a size of another electrical break 339 even though both electrical breaks 339 are aligned along a common axis. Additionally, and as shown in FIG. 3D, the traces 315 can be similar to or the same as the traces 115 described above in connection with FIGS. 1A-1D. Also, the pitches $P_7$ and $P_8$ shown in FIG. 3D are respectively similar to or the same as the pitches $P_1$ and $P_2$ described above in connection with FIGS. 1A-1D.

Figure 4:
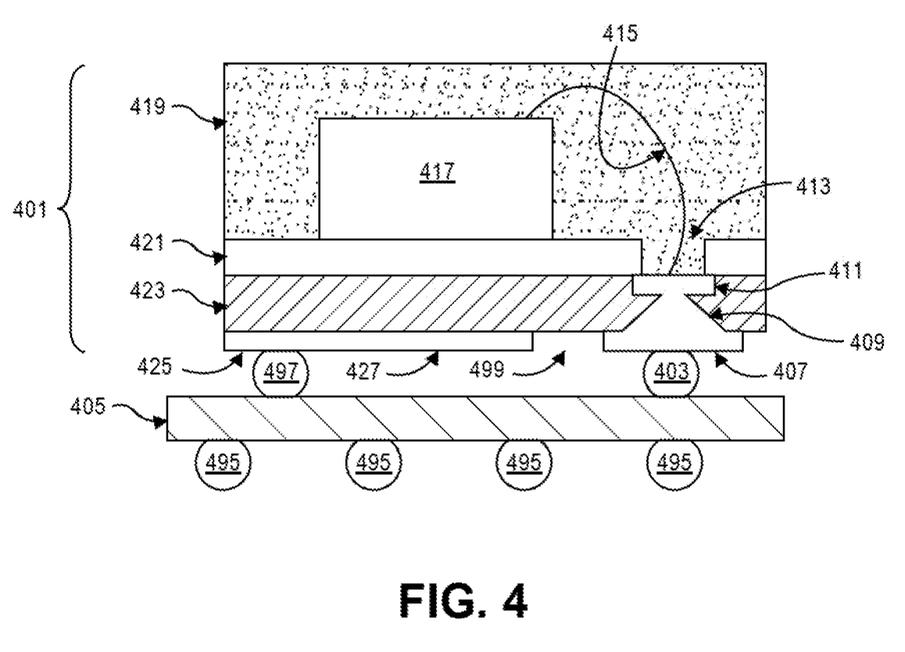
FIG. 4 is a cross sectional side view illustration of a package system, according to one embodiment.

FIG. 4 is a cross sectional side view illustration of a packaged system, according to one embodiment. The packaged system 400 may include a semiconductor package 401 that comprises one or more dies 417, a contact pad 407, a test pad 425, a pad 411, a via 409, a trace 427, a substrate 423, a solder resist layer 421, an SRO 413, an interconnection (e.g., wire, etc.) 415, and a molding compound 419. In one embodiment, the semiconductor package 401 is similar to or the same as any one of the semiconductor packages described above in connection with FIGS. 1A-3D. For example, the semiconductor package 401 may include a conductive path that has an electrical break 499 between the contact pad 407 and the trace 427.

The semiconductor package 401 can be coupled to a board (e.g., a printed circuit board (PCB), etc.) 405 using conductive interconnects 403 and support structures 497. Conductive interconnects 403 and support structures 497 may be formed from solder, copper, or any other suitable material or combination of materials known in the art. Examples of conductive interconnects 403 include, but are not limited to, solder bumps, micro bumps, pillars, and wire bonds. Examples of support structures 497 include, but are not limited to, dummy bumps.

In some embodiments, the conductive interconnects 403 and the support structures 497 are formed from the same type of material (e.g., solder, copper, any other conductive material, etc.). In these embodiments, the conductive interconnects 403 are electrically coupled to components/devices formed in or on the semiconductor package 401. Such components/devices include, but are not limited to, the contact pad 407. Furthermore, and in these embodiments, the support structures 497 are not electrically coupled to components/devices formed in or on the semiconductor package 401. That is, the support structures 497 serves no purpose other than being supports. In some embodiments, the support structures 497 are not included as part of the semiconductor package 401. Instead, the semiconductor package 401 may be supported elsewhere by other mechanisms or support structures (not shown in the FIG. 4).

The board 405 may have conductive interconnects 495 positioned thereon. Conductive interconnects 495 may be formed from solder, copper, or any other suitable conductive material or combination of conductive materials known in the art. Examples of conductive interconnects 495 include, but are not limited to, solder bumps, micro bumps, and wire bonds.

Figure 5:
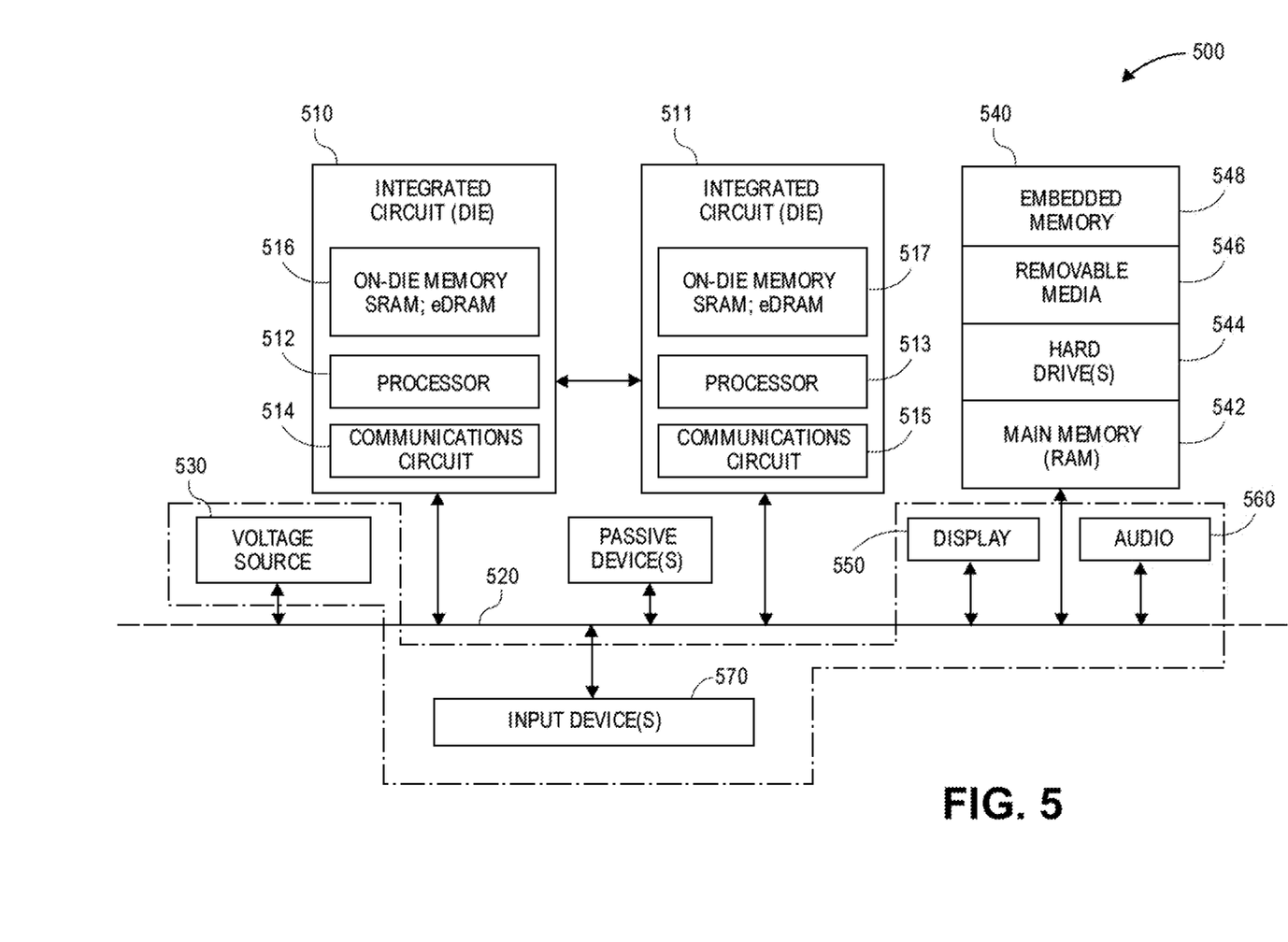
FIG. 5 is a schematic illustration of a computer system, according to one embodiment.

FIG. 5 illustrates a schematic of computer system 500 according to an embodiment. The computer system 500 (also referred to as an electronic system 500) can include a semiconductor package that has been tested using a temporary interconnect that has been designed in accordance with any of the embodiments and their equivalents as set forth in this disclosure. The computer system 500 may be a mobile device, a netbook computer, a wireless smart phone, a desktop computer, a hand-held reader, a server system, a supercomputer, or a high-performance computing system.

The system 500 can be a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In one embodiment, the voltage source 530 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512. As used herein, the processor 512 may mean any type of circuit such as, but not limited to, a microprocessor, a microcontroller, a graphics processor, a digital signal processor, or another processor. In an embodiment, the processor 512 includes, or is coupled with, a semiconductor package. In one embodiment, the integrated circuit 510 or the processor 512 is tested using a temporary interconnect that is designed in accordance with any of the embodiments and their equivalents, as described in the foregoing specification. In an embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems, or a communications circuit for servers. In an embodiment, the integrated circuit 510 includes on-die memory 516 such as static random-access memory (SRAM). In an embodiment, the integrated circuit 510 includes embedded on-die memory 516 such as embedded dynamic random-access memory (eDRAM). In one embodiment, the on-die memory 516 may be packaged with a suitable packaging process. In one embodiment, subsequent to packaging, the on-die memory 516 is tested using a temporary interconnect that is designed in accordance with any of the embodiments and their equivalents, as described in the foregoing specification.

In an embodiment, the integrated circuit 510 is complemented with a subsequent integrated circuit 511. Useful embodiments include a dual processor 513 and a dual communications circuit 515 and dual on-die memory 517 such as SRAM. In an embodiment, the dual integrated circuit 510 includes embedded on-die memory 517 such as eDRAM.

In an embodiment, the electronic system 500 also includes an external memory 540 that may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also include embedded memory 548 such as the first die in a die stack, according to an embodiment. In one embodiment, subsequent to packaging, the embedded memory 548 is tested using a temporary interconnect that is designed in accordance with any of the embodiments and their equivalents, as described in the foregoing specification.

In an embodiment, the electronic system 500 also includes a display device 550 and an audio output 560. In an embodiment, the electronic system 500 includes an input device such as a controller 570 that may be a keyboard, mouse, trackball, game controller, microphone, voice-recognition device, or any other input device that inputs information into the electronic system 500. In an embodiment, an input device 570 is a camera. In an embodiment, an input device 570 is a digital sound recorder. In an embodiment, an input device 570 is a camera and a digital sound recorder.

At least one of the integrated circuits 510 or 511 can be implemented in a number of different embodiments, including a semiconductor package, an electronic system, a computer system, one or more methods of fabricating an integrated circuit, and one or more methods of fabricating a semiconductor package. In one embodiment, subsequent to packaging, at least one of the integrated circuits is tested using a temporary interconnect that is designed according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate. A foundation substrate may be included, as represented by the dashed line of FIG. 5. Passive devices may also be included, as is also depicted in FIG. 5.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "In an embodiment," "for another embodiment," "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semiconductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures. As used herein, the phrases "A or B", "A and/or B", "one or more of A and B", and "at least one of A or B" means (A), (B), or (A and B).

Embodiments described herein relate to a semiconductor package, comprising: a die stack comprising one or more dies; a molding compound encapsulating the die stack; a substrate over the molding compound; a test pad on a surface of the substrate; a contact pad on the surface of the substrate and electrically coupled to the die stack; and a conductive path between the test pad and the contact pad, wherein the conductive path comprises an electrical break at a point along the conductive path.

Additional embodiments relate to a semiconductor package, wherein the conductive path is linear.

Additional embodiments relate to a semiconductor package, wherein the conductive path comprises two linear segments and wherein an angle between the two linear segments is greater than zero degrees.

Additional embodiments relate to a semiconductor package, wherein the conductive path comprises a trace.

Additional embodiments relate to a semiconductor package, wherein the trace terminates at the electrical break.

Additional embodiments relate to a semiconductor package, further comprising a wire extending from the trace.

Additional embodiments relate to a semiconductor package, wherein the electrical break occurs at an end of the wire opposite from the trace.

Additional embodiments relate to a semiconductor package, further comprising: a second test pad on the surface of the substrate; a second contact pad on the surface of the substrate and electrically coupled to the die stack; and a second conductive path between the second test pad and the second contact pad, wherein the second conductive path comprises an electrical break at a point along the second conductive path.

Additional embodiments relate to a semiconductor package, wherein the electrical breaks are adjacent to each other and are aligned along a common axis.

Additional embodiments relate to a semiconductor package, wherein a pitch of the contact pads is smaller than a pitch of the test pads.

Additional embodiments relate to a semiconductor package, wherein the pitch of the contact pads is less than 0.3 millimeters (mm).

Embodiments described herein relate to a semiconductor package, comprising: a die stack comprising one or more dies; a molding compound encapsulating the die stack; a substrate over the molding compound; an array of test pads on a surface of the substrate; an array of contact pads on the surface of the substrate and electrically coupled to the die stack, wherein each contact pad is paired with a test pad; and a conductive path between each pair, wherein each conductive path comprises an electrical break at a point along the conductive path, wherein each electrical break is adjacent to another electrical break, and wherein each electrical break is aligned along a common axis.

Additional embodiments relate to a semiconductor package, wherein at least one portion of a conductive path is linear.

Additional embodiments relate to a semiconductor package, wherein at least two of the electrical breaks have a same size.

Additional embodiments relate to a semiconductor package, wherein at least one of the conductive paths comprises a trace that terminates at its respective electrical break.

Additional embodiments relate to a semiconductor package, wherein a pitch of the array of contact pads is smaller than a pitch of the array of test pads.

Embodiments described herein relate to a packaged system, comprising: a printed circuit board (PCB); and a semiconductor package coupled to the PCB, comprising: first and second test pads on a surface of the substrate, wherein the first and second test pads are adjacent to each other; first and second contact pads on the surface of the substrate and electrically coupled to a die stack under the substrate, wherein the first and second contact pads are adjacent to each other; and a first conductive path between the first test pad and the first contact pad; and a second conductive path between the second test pad and the second contact pad, wherein each of the first and second conductive paths comprises an electrical break at a point along the conductive path.

Additional embodiments relate to a packaged system, wherein each of the first and second conductive paths comprises a trace that terminates at its respective electrical break.

Additional embodiments relate to a packaged system, wherein that trace that terminates at its respective electrical break comprises a wire extending from the trace and wherein the electrical break occurs at an end of the wire opposite the trace.

Embodiments described herein relate to a method of testing a semiconductor package, comprising: disposing a temporary interconnect comprising a conductive structure on a surface of a substrate, wherein the temporary interconnect electrically couples a contact pad on the surface of the substrate and a test pad, and wherein the contact pad is electrically coupled to one or more devices formed in or on the semiconductor package; and applying a voltage to the test pad to test the one or more devices.

Additional embodiments relate to a method, wherein the temporary interconnect further comprises an adhesive that physically couples the conductive structure to the test pad and the contact pad.

Additional embodiments relate to a method, wherein the temporary interconnect further comprises the test pad and wherein the contact pad is on the surface of the substrate prior to the temporary interconnect being disposed on the surface of the substrate.

Additional embodiments relate to a method, further comprising removing at least one portion of the temporary interconnect.

Additional embodiments relate to a method, wherein the temporary interconnect further comprises an adhesive that physically couples the conductive structure to the test pad and the contact pad and wherein removing at least one portion of the temporary interconnect comprises: stripping the adhesive from the test pad and the contact pad, wherein the conductive material is attached to the stripped adhesive.

Additional embodiments relate to a method, wherein the temporary interconnect comprises a wire bond that electrically couples the test pad and the contact pad and wherein removing at least one portion of the temporary interconnect comprises: removing a portion of the wire bond to form the electrical break.

The invention claimed is:

1. A semiconductor package, comprising:
   a die stack comprising one or more dies;
   a molding compound encapsulating the die stack;
   a substrate over the molding compound;
   a test pad on a surface of the substrate;
   a contact pad on the surface of the substrate and electrically coupled to the die stack; and
   a path between the test pad and the contact pad, wherein the path comprises an electrical break between a first conductive portion and a second conductive portion, the first conductive portion and the second conductive portion configured to form a conductive path during testing.

2. The semiconductor package of claim 1, wherein the path is linear.

3. The semiconductor package of claim 2, wherein the path comprises two linear segments and wherein an angle between the two linear segments is greater than zero degrees.

4. The semiconductor package of claim 1, wherein the path comprises a trace.

5. The semiconductor package of claim 4, wherein the trace terminates at the electrical break.

6. The semiconductor package of claim 4, further comprising a wire extending from the trace.

7. The semiconductor package of claim 6, wherein the electrical break occurs at an end of the wire opposite from the trace.

8. The semiconductor package of claim 1, further comprising:
   a second test pad on the surface of the substrate;
   a second contact pad on the surface of the substrate and electrically coupled to the die stack; and
   a second path between the second test pad and the second contact pad, wherein the second path is a noncontinuous path and comprises an electrical break at a point along the noncontinuous path.

9. The semiconductor package of claim 8, wherein the electrical breaks are adjacent to each other and are aligned along a common axis.

10. The semiconductor package of claim 8, wherein a pitch of the contact pads is smaller than a pitch of the test pads.

11. The semiconductor package of claim 10, wherein the pitch of the contact pads is less than 0.3 millimeters (mm).

12. The semiconductor package of claim 10, wherein at least two of the electrical breaks have a same size.

13. The semiconductor package of claim 10, wherein at least one of the paths comprises a trace that terminates at its respective electrical break.

14. The semiconductor package of claim 10, wherein a pitch of the array of contact pads is smaller than a pitch of the array of test pads.

15. A semiconductor package, comprising:
   a die stack comprising one or more dies;
   a molding compound encapsulating the die stack;
   a substrate over the molding compound;
   an array of test pads on a surface of the substrate;
   an array of contact pads on the surface of the substrate and electrically coupled to the die stack, wherein each contact pad is paired with a test pad; and
   a path between each pair, wherein each path is a noncontinuous path and comprises an electrical break between a first conductive portion and a second conductive portion, the first conductive portion and the second conductive portion configured to form a conductive path during testing, wherein each electrical break is adjacent to another electrical break, and wherein each electrical break is aligned along a common axis.

16. The semiconductor package of claim 15, wherein at least one portion of one or more of the paths is linear.

17. A packaged system, comprising:
   a printed circuit board (PCB); and
   a semiconductor package coupled to the PCB, comprising:
      first and second test pads on a surface of the substrate, wherein the first and second test pads are adjacent to each other;
      first and second contact pads on the surface of the substrate and electrically coupled to a die stack under the substrate, wherein the first and second contact pads are adjacent to each other; and
      a first path between the first test pad and the first contact pad;
      and
      a second path between the second test pad and the second contact pad, wherein each of the first and second paths comprises an electrical break between a first conductive portion and a second conductive portion, the first conductive portion and the second conductive portion configured to form a conductive path during testing.

18. The packaged system of claim 17, wherein each of the first and second paths comprises a trace that terminates at its respective electrical break.

19. The packaged system of claim 18, wherein that trace that terminates at its respective electrical break comprises a wire extending from the trace and wherein the electrical break occurs at an end of the wire opposite the trace.

20. A method of testing a semiconductor package, comprising:
   disposing a temporary interconnect comprising a conductive structure on a surface of a substrate, wherein the temporary interconnect electrically couples a contact pad on the surface of the substrate and a test pad, and wherein the contact pad is electrically coupled to one or more devices formed in or on the semiconductor package; and
   applying a voltage to the test pad to test the one or more devices.

21. The method of claim 20, wherein the temporary interconnect further comprises an adhesive that physically couples the conductive structure to the test pad and the contact pad.

22. The method of claim 20, wherein the temporary interconnect further comprises the test pad and wherein the contact pad is on the surface of the substrate prior to the temporary interconnect being disposed on the surface of the substrate.

23. The method of claim 20, further comprising removing at least one portion of the temporary interconnect.

24. The method of claim 23, wherein the temporary interconnect further comprises an adhesive that physically couples the conductive structure to the test pad and the contact pad and wherein removing at least one portion of the temporary interconnect comprises:
   stripping the adhesive from the test pad and the contact pad, wherein the conductive material is attached to the stripped adhesive.

25. The method of claim 23, wherein the temporary interconnect comprises a wire bond that electrically couples the test pad and the contact pad and wherein removing at least one portion of the temporary interconnect comprises:
   removing a portion of the wire bond to form the electrical break.

\* \* \* \* \*